United States Patent [19]
Iwase

[11] Patent Number: 6,034,910
[45] Date of Patent: Mar. 7, 2000

[54] SEMICONDUCTOR MEMORY DEVICE TO WHICH SERIAL ACCESS IS MADE AND A METHOD FOR ACCESSING THE SAME

[75] Inventor: Taira Iwase, Kawasaki, Japan

[73] Assignee: Kabushiki Kaisha Toshiba, Kawasaki, Japan

[21] Appl. No.: 09/204,776

[22] Filed: Dec. 3, 1998

[30] Foreign Application Priority Data

Dec. 5, 1997 [JP] Japan ................................. 9-335899

[51] Int. Cl.⁷ ...................................................... G11C 7/00
[52] U.S. Cl. ..................... 365/221; 365/240; 365/230.03; 365/236
[58] Field of Search ..................................... 365/221, 240, 365/196, 230.06, 230.08, 189.05, 189.12, 236, 230.03

[56] References Cited

U.S. PATENT DOCUMENTS 4,667,313  5/1987  Pinkham et al. ......................... 365/240
4,943,947  7/1990  Kobayashi ........................... 365/189.12

Primary Examiner—David Nelms
Assistant Examiner—Thong Le
Attorney, Agent, or Firm—Loeb & Loeb, LLP

[57] ABSTRACT

A memory cell array is divided into a plurality of blocks and sense amplifiers and shift registers are provided for the respective blocks. After a plurality of data sets are read out in the first random access cycle and transferred to each of the shift registers, column switching is made and a plurality of next data sets are read out. Then, the pipeline processing for the data items is effected to serially read out data in the serial access cycle.

20 Claims, 8 Drawing Sheets

SEMICONDUCTOR MEMORY DEVICE TO WHICH SERIAL ACCESS IS MADE AND A METHOD FOR ACCESSING THE SAME

BACKGROUND OF THE INVENTION

This invention relates to a semiconductor memory device and a method for accessing the same and more particularly to a memory to which serial access is made.

Conventionally, a serial access memory is manufactured as an inexpensive semiconductor memory device. FIG. 1 is a circuit diagram showing an extracted portion of a circuit associated with access to memory cells in a serial access type mask ROM used as one example of this type of semiconductor memory device. In a memory cell array 11, memory cells MC, MC, . . . are arranged in a matrix form. The memory cells MC, MC, . . . are disposed in intersecting positions between word lines WL, WL, . . . extending in a row direction and bit lines BL, BL, . . . extending in a column direction. The gates of the memory cells MC, MC, . . . on the same row are connected to a corresponding one of the word lines WL, WL, . . . , the drains thereof on the same column are connected to a corresponding one of the bit lines BL, BL, . . . and the sources thereof are connected to a ground node. Data is programmed into the memory cells MC, MC, . . . by use of a photomask in the manufacturing process by forming a MOS transistor or not, forming a depletion type MOS transistor or enhancement type MOS transistor, or forming a contact hole or not according to storage data of "0" or "1" Sense amplifiers (S/A) 12, 12, . . . are respectively connected to the bit lines BL, BL, . . . A row decoder 13 decodes a row address signal RAdd to selectively drive the word lines WL, WL, . . . A circuit portion of the row decoder 13 which corresponds to one word line WL is constructed by a NAND gate and an inverter for inverting the output signal of the NAND gate, for example. A column decoder 14 decodes an output signal of a column address counter 15 to selectively control the ON/OFF states of column selection transistors 16, 16, . . . A circuit portion of the column decoder 14 which corresponds to one column selection transistor 16 is constructed by a NAND gate and an inverter for inverting the output signal of the NAND gate, for example. The column address counter 15 is supplied with a column address signal CAdd, address latch enable signal ALE and read signal $\overline{RD}$. One-side ends of the current paths of the column selection transistors 16, 16, . . . are respectively connected to the output terminals of the sense amplifiers 12, 12, . . . and the other ends thereof are commonly connected to the input terminal of an output buffer 17. The read signal $\overline{RD}$ is input to the output buffer 17 which in turn outputs read out data $D_{OUT}$ from a selected memory cell MC.

FIG. 2 is a timing chart for schematically illustrating the readout operation of the mask ROM shown in FIG. 1. An address input $A_{IN}$ (containing the row address signal RAdd and column address signal CAdd) is supplied to the column address counter 15 and row decoder 13 in response to the down-edge of the address latch enable signal ALE. The row address signal RAdd is decoded in the row decoder 13 and the word lines WL, WL, . . . are selectively driven according to the decoded output. Since the memory cells MC, MC, . . . on the same row are connected to a corresponding one of the word -lines WL, WL, . . . , the row of the memory cells MC, MC, . . . in the memory cell array 11 are selected by the row decoder 13.

The column address signal CAdd is set in the column address counter 15 as an initial value and the count value of the counter 15 is supplied to and decoded by the column decoder 14. After the word line WL is selected by the row decoder 13, the column address counter 15 effects the count-up operation in synchronism with the read signal $\overline{RD}$. A decoded output signal of the column decoder 14 is supplied to the gates of the column selection transistors 16, 16, . . . to sequentially control the ON/OFF states of the transistors 16, 16, . . . . Storage data items of the memory cells MC, MC, . . . of one row connected to the word line WL driven by the row decoder 13 are respectively read out on the bit lines BL, BL, . . . , supplied to the sense amplifiers 12, 12, . . . and sensed and amplified by the sense amplifiers. Then, data is supplied to the output buffer 17 via the column selection transistor 16 selected by the column decoder 14 and output as read out data $D_{OUT}$. The output operation of the output buffer 17 is controlled by the read signal $\overline{RD}$ and read out data items $D_{OUT}$ of the address N, address (N+1), address (N+2) . . . are serially output in response to the read signal $\overline{RD}$.

Since the conventional serial access memory described above has the sense amplifiers 12, 12, . . . provided for the respective bit lines BL, BL, . . . and the number of sense amplifiers is large, there occurs a problem that the power consumption is high and the chip size becomes large. In addition, the memory cell of the mask ROM is formed of one transistor, but the sense amplifier 12 requires at least 6 transistors, and it becomes more difficult to dispose the sense amplifier 12 in a pitch between the memory cells MC and MC as the memory cell size becomes smaller, thereby making it extremely difficult to make the appropriate layout of the sense amplifiers 12, 12, . . . .

BRIEF SUMMARY OF THE INVENTION

Accordingly, a first object of this invention is to provide a serial access type semiconductor memory device in which the chip size can be reduced and the power consumption can be lowered by reducing the number of sense amplifiers and a method for accessing the same.

Further, a second object of this invention is to provide a serial access type semiconductor memory device in which the layout of the sense amplifiers will not be limited by the pitch between the memory cells and the layout of the sense amplifiers can be easily made even if the memory cell size is reduced and a method for accessing the same.

The above first and second objects can be attained by a semiconductor memory device comprising a memory cell array divided into a plurality of blocks; a plurality of first means respectively provided for the plurality of blocks, each for amplifying data read out from a memory cell in a corresponding one of the blocks; and a plurality of second means respectively provided for the plurality of first means, for latching data read out from the plurality of first means; wherein data items of an integral multiple (not smaller than 2) of the number of the plurality of first means are successively read out from the plurality of second means.

With the above construction, since the sense amplifier is commonly used by a plurality of columns, the number of sense amplifiers can be significantly reduced, the chip size can be reduced and the power consumption can be lowered. Further, since the layout of the sense amplifiers is not limited by the pitch between the memory cells, the sense amplifiers can be easily laid out even when the memory cell size is reduced.

The above first and second objects can be attained by a semiconductor memory device comprising a memory cell array divided into n (n is an integral number not smaller than 2) blocks; n column selectors respectively provided for the blocks, n sense amplifiers respectively provided for the blocks, for receiving data on the columns selected by the column selectors; n shift registers respectively provided for the blocks, for receiving outputs of the sense amplifiers; n output switching circuits respectively provided for the blocks, for receiving outputs of the shift registers; an output buffer supplied with outputs of the output switching circuits; a first column address counter in which a first column address signal for specifying a data read out starting block is set as an initial value, for counting a timing signal in response to an address latch enable signal; a first column decoder for decoding a count value of the first column address counter to control the output switching circuits; a timing circuit supplied with the address latch enable signal and a read signal, for supplying a transfer control timing signal to the shift registers and supplying a counting timing signal to the first column address counter when the n-th block is selected by the first column decoder; a second column address counter in which a second column address signal is set as an initial value, for counting the read signal in response to the address latch enable signal; a second column decoder for decoding a count value of the second column address counter to control the column selectors; and a row decoder for decoding a row address signal and supplying the decoded signal to the n blocks in the memory cell array; wherein after data items read out from the memory cells in the n blocks which are selected by the column selectors are transferred to the shift registers via the sense amplifiers, the second column address counter is incremented, column access is made by the second column decoder, and data items of an integral multiple (not smaller than 2) of n are read out by effecting the above operation once or more than once and serial access is made by effecting the pipeline processing for the data items.

With the above construction, since it is sufficient to use n sense amplifiers which are the same in number as the blocks, the number of sense amplifiers can be significantly reduced, the chip size can be reduced and the power consumption can be lowered. Further, since the layout of the sense amplifiers is not limited by the pitch between the memory cells, the sense amplifiers can be easily laid out even when the memory cell size is reduced.

Further, the above first and second objects can be attained by a method for accessing a semiconductor memory device, comprising the steps of making first row and column access in a first row and column access cycle; amplifying and transferring data read out in the first row and column access to a shift register; incrementing the column address; and reading out data items of an integral multiple (not smaller than 2) of the number of sense amplifiers by making second column access by use of the incremented column address; wherein serial access is made while the pipeline processing for data items of an integral multiple (not smaller than 2) of the number of sense amplifiers is effected.

By the above method, since data items which are twice the number of sense amplifiers are read out and access is made while the pipeline processing is effected for the data items, data items can be successively and serially read out even if a data readout starting address is located in any position of the memory cell array.

Further, the above first and second objects can be attained by a method for accessing a semiconductor memory device which includes a memory cell array divided into n (n is an integral number not smaller than 2) blocks; n column selectors respectively provided for the blocks, n sense amplifiers respectively provided for the blocks, for receiving data on the columns selected by the column selectors; n shift registers respectively provided for the blocks, for receiving outputs of the sense amplifiers; n output switching circuits respectively provided for the blocks, for receiving outputs of the shift registers; an output buffer supplied with outputs of the output switching circuits; a first column address counter in which a first column address signal for specifying a data read out starting block is set as an initial value, for counting a timing signal in response to an address latch enable signal; a first column decoder for decoding a count value of the first column address counter to control the output switching circuits; a timing circuit supplied with the address latch enable signal and a read signal, for supplying a transfer control timing signal to the shift registers and supplying a counting timing signal to the first column address counter when the n-th block is selected by the first column decoder; a second column address counter in which a second column address signal is set as an initial value, for counting the read signal in response to the address latch enable signal; a second column decoder for decoding a count value of the second column address counter to control the column selectors; and a row decoder for decoding a row address signal and supplying the decoded signal to the n blocks in the memory cell array; comprising the steps of transferring data items read out from the memory cells in the n blocks which are selected by the column selectors to the shift registers via the sense amplifiers; in-crementing the second column address counter; making column access by the second column decoder, and reading out data items of an integral multiple (not smaller than 2) of n by effecting the above operation once or more than once and effecting the pipeline processing for the data items.

By the above method, since data items which are twice the number of sense amplifiers are read out and access is made while the pipeline processing is effected for the data items, data items can be successively and serially read out even if a data readout starting address is located in any position of the memory cell array.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
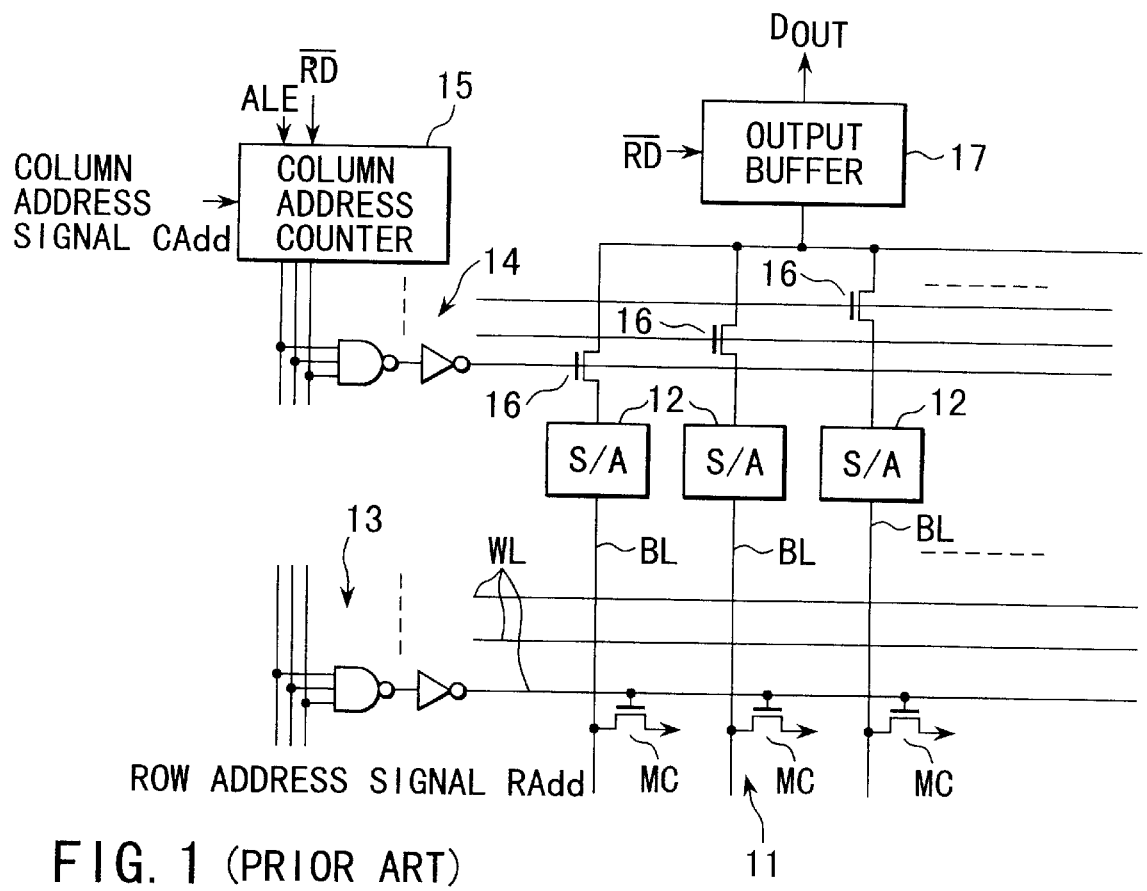
FIG. 1 is a circuit diagram showing an extracted portion of a circuit associated with access to a memory cell in a serial access type mask ROM, for illustrating a conventional semiconductor memory device.
Figure 2:
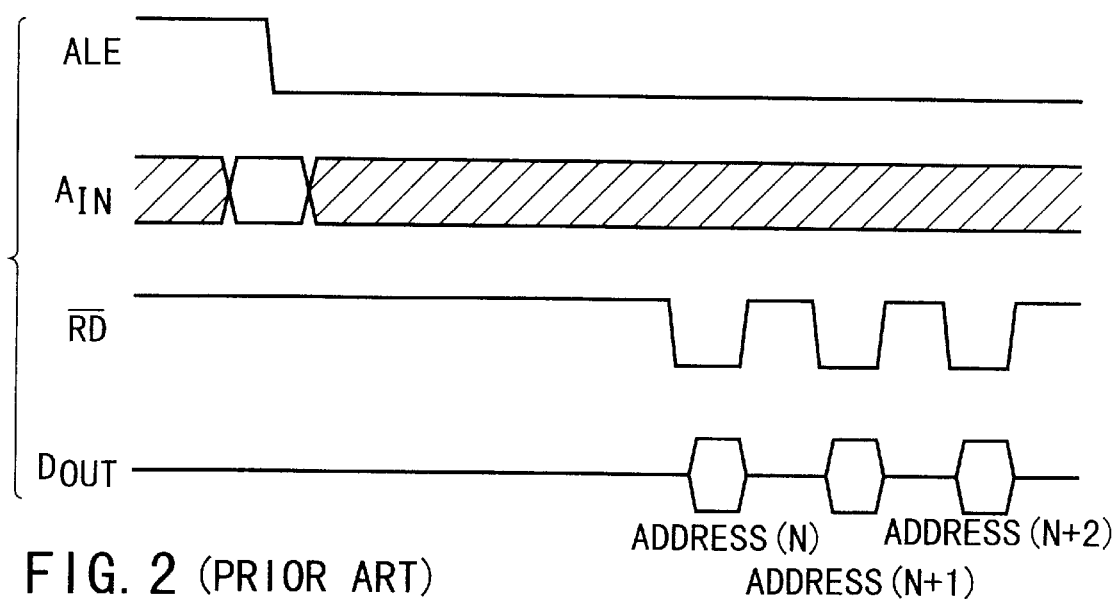
FIG. 2 is a timing chart for schematically illustrating the readout operation of the mask ROM shown in FIG. 1.
Figure 3:
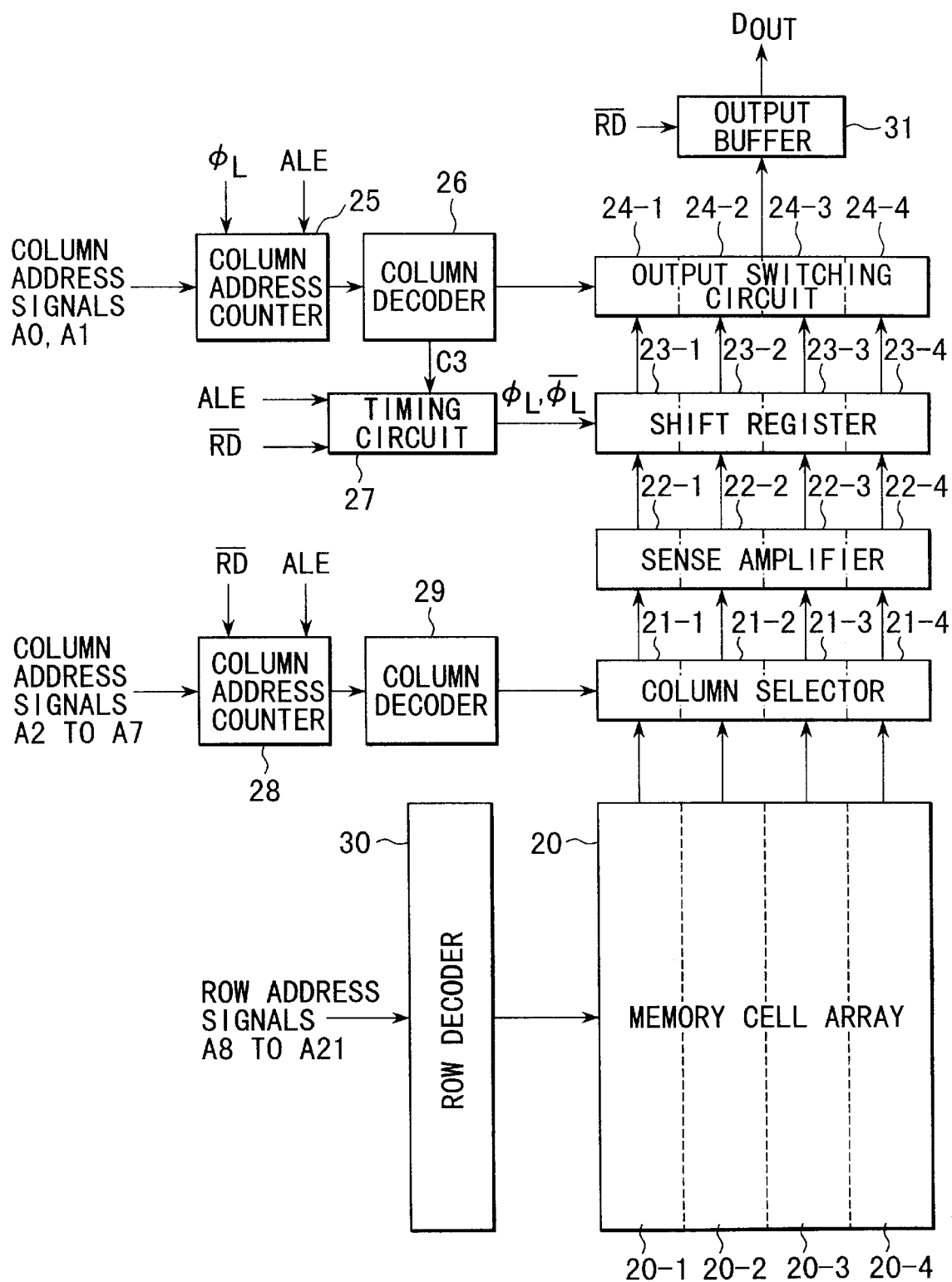
FIG. 3 is a block diagram showing the schematic construction of a serial access type mask ROM for illustrating a semiconductor memory device according to a first embodiment of this invention and a method for accessing the same.

FIG. 3 is a block diagram showing the schematic construction of a serial access type mask ROM for illustrating a semiconductor memory device according to a first embodiment of this invention and a method for accessing the same. The circuit includes a memory cell array 20, column selectors 21-1 to 21-4, sense amplifiers 22-1 to 22-4, shift registers 23-1 to 23-4, output switching circuits 24-1 to 24-4, first column address counter 25, first column decoder 26, timing circuit 27, second column address counter 28, second column decoder 29, row decoder 30 and output buffer 31.

The memory cell array 20 is divided into four blocks 20-1 to 20-4. The column selectors 21-1 to 21-4, sense amplifiers 22-1 to 22-4, shift registers 23-1 to 23-4 and output switching circuits 24-1 to 24-4 are respectively provided to correspond to the blocks 20-1 to 20-4 of the memory cell array 20.

Column address signals A0, A1 for specifying one of the blocks 20-1 to 20-4 from which the serial access is started, timing signal $\phi_L$ and address latch enable signal ALE are supplied to the first column address counter 25. An output signal of the counter 25 is supplied to and decoded by the first column decoder 26. An output signal of the first column decoder 26 is supplied to the output switching circuits 24-1 to 24-4.

Further, the address latch enable signal ALE, read signal $\overline{RD}$ and an output signal C3 (which is a signal indicating that the block 20-4 is selected) of the first column decoder 26 are supplied to the timing circuit 27, data transfer control timing signals $\phi_L$, $\overline{\phi_L}$ output from the timing circuit 27 are supplied to the shift registers 23-1 to 23-4 and the timing signal $\phi_L$ is supplied to the first column address counter 25.

Column address signals A2 to A7, read signal $\overline{RD}$ and address latch enable signal ALE are supplied to the second column address counter 28. The count value of the counter 28 is supplied to and decoded by the second column decoder 29. A decoded output of the second column decoder 29 is supplied to the column selectors 21-1 to 21-4.

Further, row address signals A8 to A21 are supplied to the row decoder 30 and buffer 31 and a decoded output of the row decoder 30 is supplied to the memory cell array 20. Output signals of the output switching circuits 24-1 to 24-4 are supplied to the output buffer 31 and data is serially output from the output buffer 31 as read out data $D_{OUT}$ in response to the read signal $\overline{RD}$.

Figure 4:
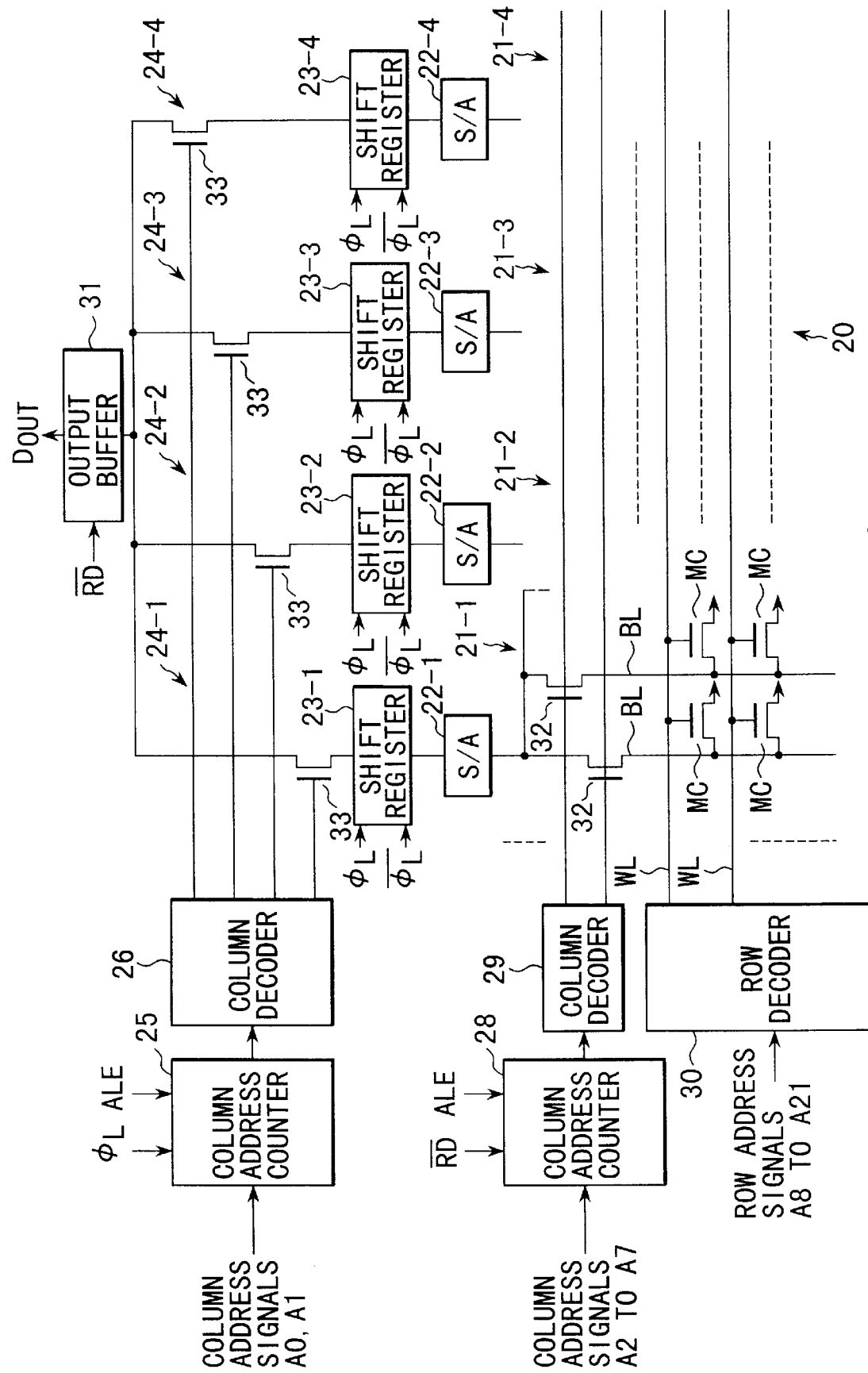
FIG. 4 is a circuit diagram specifically showing an extracted portion of a circuit associated with access to a memory cell in the serial access type mask ROM shown in FIG. 3.

FIG. 4 is a circuit diagram specifically showing an extracted portion of a circuit associated with access to a memory cell in the serial access type mask ROM shown in FIG. 3. In FIG. 4, portions which are the same as those of FIG. 3 are denoted by the same reference numerals as in FIG. 3. Memory cells MC, MC, . . . in the memory cell array 20 are arranged in a matrix form. The gates of the memory cells MC, MC, . . . on the same row are connected to a corresponding one of word lines WL, WL, . . . which are selectively driven by the row decoded signal output from the row decoder 30. The drains of the memory cells MC, MC, . . . on the same column are connected to a corresponding one of bit lines BL, BL, . . . One-side ends of the bit lines BL, BL, . . . are respectively connected to one-side ends of the current paths of MOS transistors 32, 32, . . . acting as the column selectors 21-1 to 21-4. The sources of the memory cells MC, MC, . . . are connected to a ground node. Data is programmed into the memory cells MC, MC, . . . by use of a photomask in the manufacturing process by forming a MOS transistor or not, forming a depletion type MOS transistor or enhancement type MOS transistor, or forming a contact hole or not according to storage data of "0" or "1".

The other ends of the current paths of the MOS transistors 32, 32, . . . are commonly connected for each block and the commonly connected ends are respectively connected to the input terminals of the sense amplifiers 22-1 to 22-4. The output switching circuits 24-1 to 24-4 are constructed by MOS transistors 33, 33, . . . for controlling data transfer from the shift registers 23-1 to 23-4 to the output buffer 31. The decoded output of the first column decoder 26 is supplied to the gates of the MOS transistors 33, 33, . . .

Figure 5:
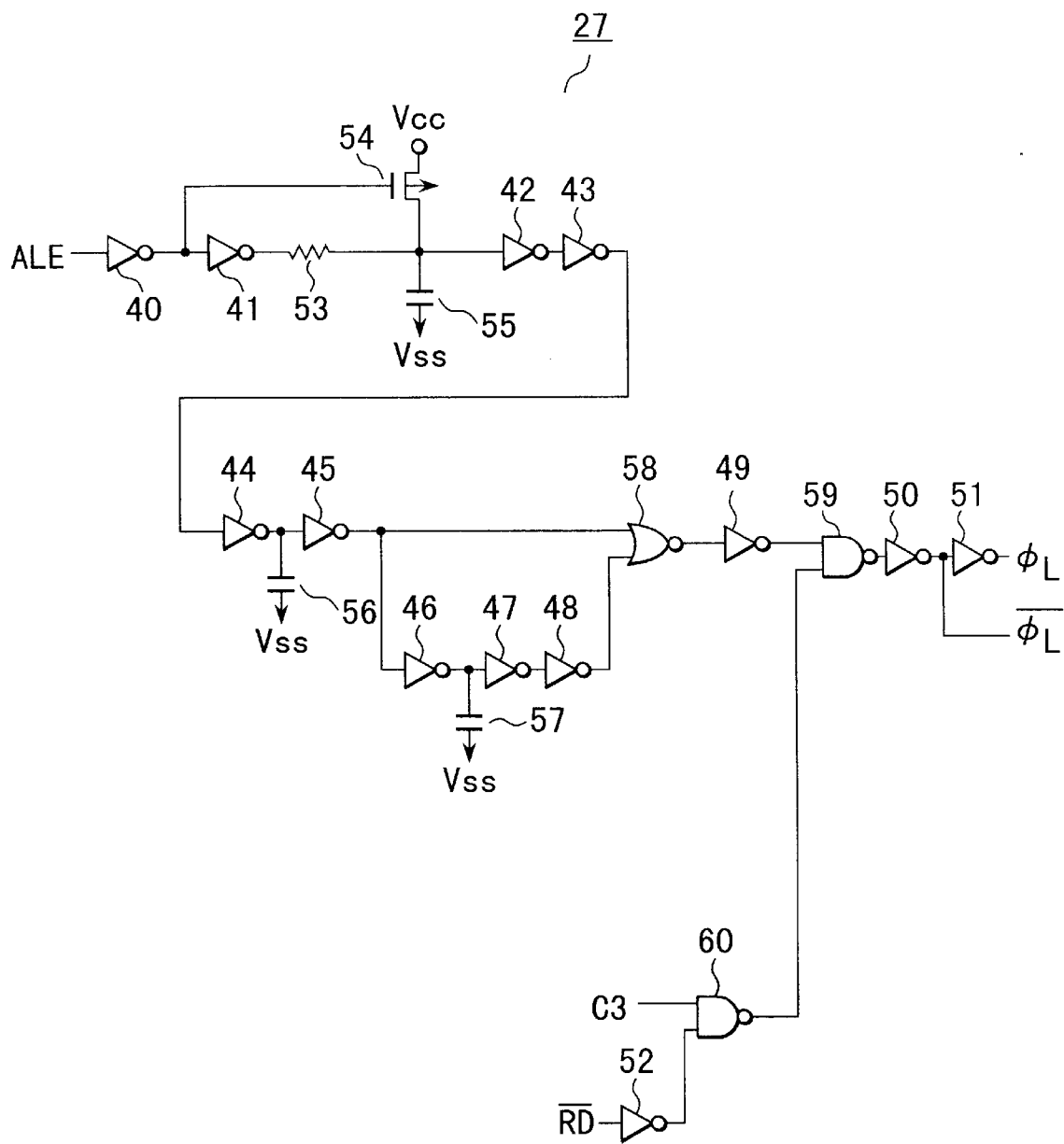
FIG. 5 is a circuit diagram showing an example of the construction of a timing circuit in the mask ROM shown in FIG. 3.

FIG. 5 is a circuit diagram showing an example of the construction of the timing circuit 27 in the mask ROM shown in FIG. 3. The timing circuit 27 includes inverters 40 to 52, resistor 53, P-channel MOS transistor 54, capacitors 55 to 57, NOR gate 58 and NAND gates 59, 60. The address latch enable signal ALE is supplied to the input terminal of the inverter 40. The output terminal of the inverter 40 is connected to the input terminal of the inverter 41 and the gate of the MOS transistor 54. The output terminal of the inverter 41 is connected to one end of the resistor 53 the other end of which is connected to the drain of the MOS transistor 54, one of the electrodes of the capacitor 55 and the input terminal of the inverter 42. The source of the MOS transistor 54 is connected to a power supply Vcc and the other electrode of the capacitor 55 is connected to a ground node Vss. The output terminal of the inverter 42 is connected to the input terminal of the inverter 43 whose output terminal is connected to the input terminal of the inverter 44. The output terminal of the inverter 44 is connected to the input terminal of the inverter 45. The capacitor 56 is connected between the output terminal of the inverter 44 and the ground node Vss. The output terminal of the inverter 45 is connected to one input terminal of the NOR gate 58 and the input terminal of the inverter 46. The output terminal of the inverter 46 is connected to the input terminal of the inverter 47. The capacitor 57 is connected between the output terminal of the inverter 46 and the ground node Vss. The output terminal of the inverter 47 is connected to the input terminal of the inverter 48 whose output terminal is connected to the other input terminal of the NOR gate 58. The output terminal of the NOR gate 58 is connected to the input terminal of the inverter 49 whose output terminal is connected to one input terminal of the NAND gate 59.

The read signal $\overline{RD}$ is supplied to the input terminal of the inverter 52. The output terminal of the inverter 52 is connected to one input terminal of the NAND gate 60 and the output signal C3 of the first column decoder 26 is supplied to the other input terminal of the NAND gate 60. The output terminal of the NAND gate 60 is connected to the other input terminal of the NAND gate 59 whose output terminal is connected to the output terminal of the inverter 50. The timing signal $\overline{\phi_L}$ is output from the output terminal of the inverter 50. The output terminal of the inverter 50 is connected to the input terminal of the inverter 51 and the timing signal $\phi_L$ is output from the output terminal of the inverter 51.

The timing circuit 27 of FIG. 5 is so constructed that the second-time timing signals $\phi_L$, $\overline{\phi_L}$ may be output in synchronism with the read signal $\overline{RD}$ in order to simplify the construction of the circuit, but the signals may be a one-shot pulse.

Figure 6:
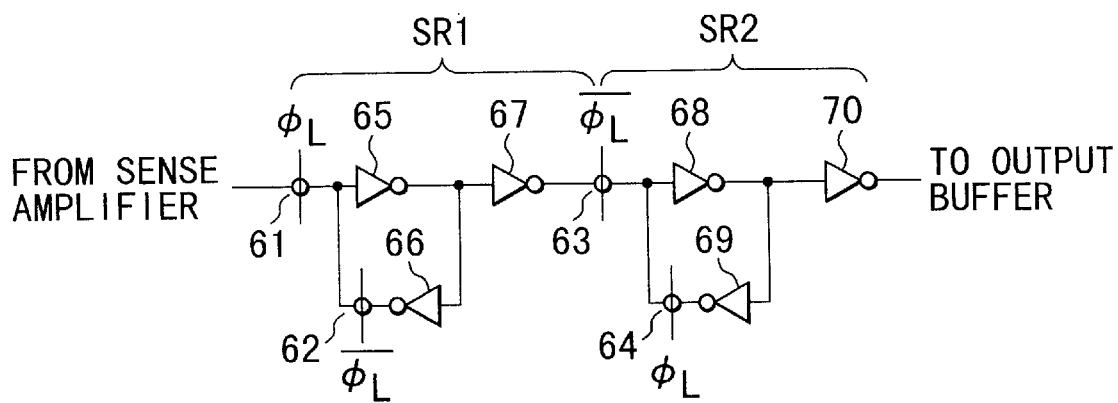
FIG. 6 is a circuit diagram showing an example of the construction of a shift register in the circuit of FIGS. 3 and 4.

FIG. 6 shows an example of the construction of one of the shift registers 23-1 to 23-4 in the circuit of FIGS. 3 and 4. The shift register includes MOS transistors 61 to 64 and inverters 65 to 70. An output signal of a corresponding one of the sense amplifiers is supplied to one end of the current path of the MOS transistor 61. The other end of the current path of the MOS transistor 61 is connected to the input terminal of the inverter 65 and one end of the current path of the MOS transistor 62 and the gate thereof is supplied with the timing signal $\phi_L$. The output terminal of the inverter 65 is connected to the input terminals of the inverters 66, 67. The output terminal of the inverter 66 is connected to the other end of the current path of the MOS transistor 62 and the gate of the MOS transistor 62 is supplied with the timing signal $\overline{\phi_L}$. The output terminal of the inverter 67 is connected to one end of the current path of the MOS transistor 63, the other end of the current path of the MOS transistor 63 is connected to the input terminal of the inverter 68 and one end of the current path of the MOS transistor 64, and the gate of the MOS transistor 63 is supplied with the timing signal $\overline{\phi_L}$. The output terminal of the inverter 68 is connected to the input terminals of the inverters 69, 70 and the output terminal of the inverter 69 is connected to the other end of the current path of the MOS transistor 64. The gate of the MOS transistor 64 is supplied with the timing signal $\phi_L$. The output signal of the inverter 70 is supplied to the output buffer 31.

The MOS transistors 61, 62 and the inverters 65, 66, 67 constitute a first stage SR1 of the shift register, and the MOS transistors 63, 64 and the inverters 68, 69, 70 constitute a second stage SR2 of the shift register. The output signal of the sense amplifier is transferred to the first stage SR1 in synchronism with the timing signal $\phi_L$ and latched therein in synchronism with the timing signal $\overline{\phi_L}$. Further, data latched in the first stage SR1 is transferred to the second stage SR2 in synchronism with the timing signal $\overline{\phi_L}$ and latched therein in synchronism with the timing signal $\phi_L$.

Figure 7:
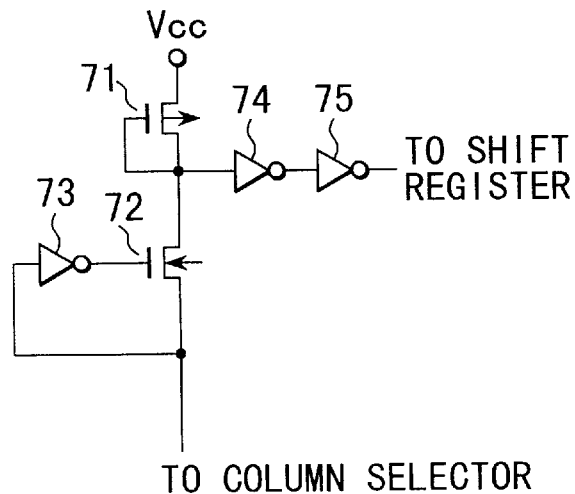
FIG. 7 is a circuit diagram showing an example of the construction of a sense amplifier in the circuit of FIGS. 3 and 4.

FIG. 7 shows an example of the construction of one of the sense amplifiers 22-1 to 22-4 in the circuit of FIGS. 3 and 4. The sense amplifier includes a P-channel MOS transistor 71, N-channel MOS transistor 72, and inverters 73 to 75. The source of the MOS transistor 71 is connected to the power supply Vcc and the gate and drain thereof are connected together. The drain of the MOS transistor 72 is connected to the drain of the MOS transistor 71 and the source thereof is connected to the other input terminals of the MOS transistors 32, 32, . . . acting as a corresponding one of the column selectors 21-1 to 21-4. The input terminal of the inverter 73 is connected to the source of the MOS transistor 72 and the output terminal thereof is connected to the gate of the MOS transistor 72. The input terminal of the inverter 74 is connected to the drain common connection node of the MOS transistors 71, 72, and the output terminal thereof is connected to the input terminal of the inverter 75. An amplified signal output from the output terminal of the inverter 75 is supplied to a corresponding one of the shift registers 23-1 to 23-4.

Figure 8:
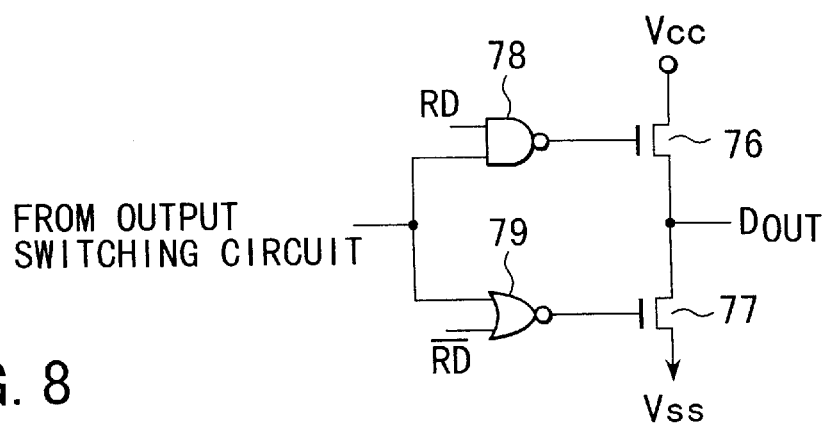
FIG. 8 is a circuit diagram showing an example of the construction of an output buffer in the circuit of FIGS. 3 and 4.

FIG. 8 shows an example of the construction of the output buffer 31 in the circuit of FIGS. 3 and 4. The output buffer includes MOS transistors 76, 77, NAND gate 78 and NOR gate 79. The current paths of the MOS transistors 76, 77 are serially connected between the power supply Vcc and the ground node Vss. One input terminal of the NAND gate 78 is supplied with the output signal from the output switching circuits 24-1 to 24-4, the other input terminal thereof is supplied with the read signal RD, and the output terminal thereof is connected to the gate of the MOS transistor 76. One input terminal of the NOR gate 79 is supplied with the output signal from the output switching circuits 24-1 to 24-4, the other input terminal thereof is supplied with the read signal $\overline{RD}$, and the output terminal thereof is connected to the gate of the MOS transistor 77. The output signal $D_{OUT}$ is output from the common connection node of the MOS transistors 76 and 77.

Figure 9A:
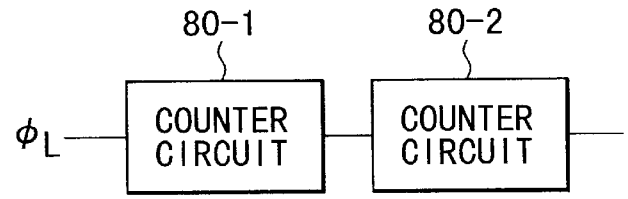
FIG. 9A is a block diagram showing an example of the construction of a first column address counter in the circuit of FIGS. 3 and 4.
Figure 9B:
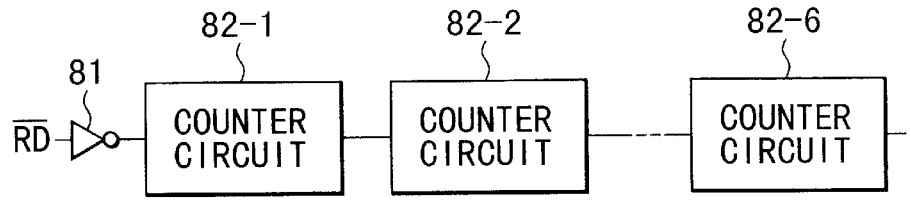
FIG. 9B is a block diagram showing an example of the construction of a second column address counter in the circuit of FIGS. 3 and 4.
Figure 9C:
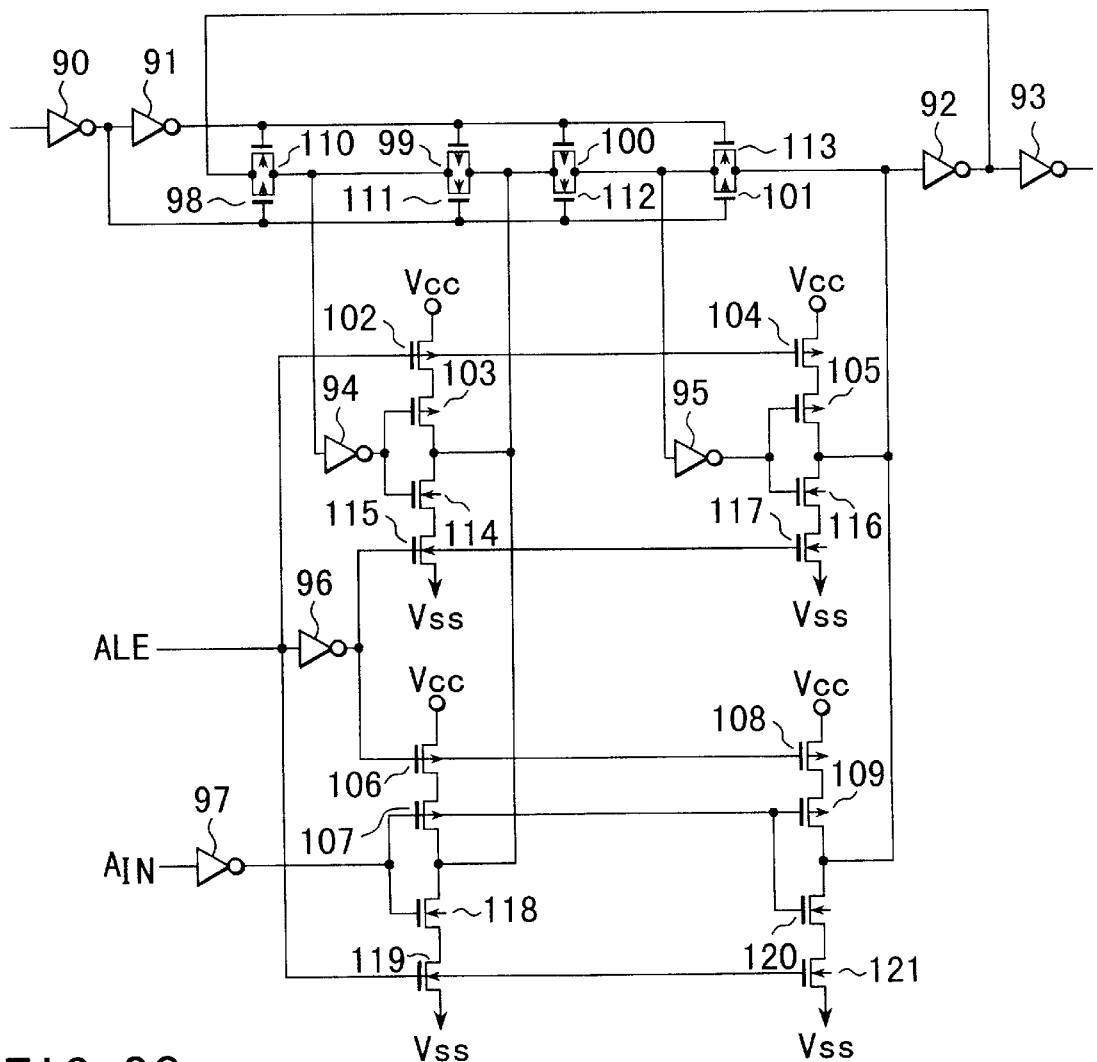
FIG. 9C is a circuit diagram showing an example of the construction of each counter circuit in the circuit shown in FIGS. 9A and 9B.

FIG. 9A is a block diagram the first column address counter 25 for counting the timing signal $\phi_L$ in the circuit of FIGS. 3 and 4. FIG. 9B is a block diagram of the second column address counter 28 for counting the read signal $\overline{RD}$ in the circuit of FIGS. 3 and 4. FIG. 9C shows an example of the specific construction of one bit of the counter shown in FIGS. 9A and 9B.

As shown in FIG. 9A, the first column address counter 25 is constructed by two-stage counter circuits 80-1, 80-2, and as shown in FIG. 9B, the second column address counter 28 is constructed by an inverter 81 and counter circuits 82-1, 82-2, . . . , 82-6 which are cascade-connected.

As shown in FIG. 9C, each of the counter circuits is constructed by inverters 90 to 97, P-channel MOS transistors 98 to 109 and N-channel MOS transistors 110 to 121. The input terminal of the inverter 90 is supplied with an increment signal (which is an output signal of the preceding-stage counter circuit and is the timing signal $\phi_L$ in the case of the first-stage counter circuit 80-1 in the first column address counter 26 or a signal obtained by inverting the read signal $\overline{RD}$ by the inverter 81 in the case of the firs-stage counter circuit 82-1 in the second column address counter 28). The output terminal of the inverter 90 is connected to the input terminal of the inverter 91 and the gates of the MOS transistors 98, 111, 112, 101. The output terminal of the inverter 91 is connected to the gates of the MOS transistors 110, 99, 100, 113. The current paths of the MOS transistors 110 and 98, 99 and 111, 100 and 112, and 113 and 101 are connected in parallel to respectively constitute transfer gates and the transfer gates are cascade-connected between the input terminal and the output terminal of the inverter 92. The current paths of the MOS transistors 102, 103, 114, 115 are serially connected between the power supply Vcc and the ground node Vss. Further, the current paths of the MOS transistors 104, 105, 116, 117 are serially connected between the power supply Vcc and the ground node Vss. In addition, the current paths of the MOS transistors 106, 107, 118, 119 are serially connected between the power supply Vcc and the ground node Vss. Further, the current paths of the MOS transistors 108, 109, 120, 121 are serially connected between the power supply Vcc and the ground node Vss. The address latch enable signal ALE is supplied to the gates of the MOS transistors 102, 104, 119, 121 and the input terminal of the inverter 96. The output terminal of the inverter 96 is connected to the gates of the MOS transistors 115, 117, 106, 108. The address signal AIN (which is the column address signal A0 in the case of the counter circuit 80-1 in the column address counter 25, the address signal A1 in the case of the counter circuit 80-2 or the column address signals A2 to A7 in the case of the counter circuits 82-1 to 82-6 in the column address counter 28) is supplied to the input terminal of the inverter 97 and the output terminal of the inverter 97 is connected to the gates of the MOS transistors 107, 118, 109, 120. The input terminal of the inverter 94 is connected to the connection node of the MOS transistors 110, 98 and the MOS transistors 99, 111 and the output terminal of the inverter 94 is connected to the gates of the MOS transistors 103, 114. Further, the connection node of the MOS transistors 103 and 114 and the connection node of the MOS transistors 107 and 118 are connected to the connection node of the MOS transistors 99, 111 and the MOS transistors 100, 112. The input terminal of the inverter 95 is connected to the connection node of the MOS transistors 100, 112 and the MOS transistors 113, 101 and the output terminal of the inverter 95 is connected to the gates of the MOS transistors 105, 116. Further, the input terminal of the inverter 92 is also connected to the connection node of the MOS transistors 105, 116 and the connection node of the MOS transistors 109, 120. The output terminal of the inverter 92 is connected to the input terminal of the inverter 93 and an increment signal (which is a count value in the case of the final stage) of the next-stage counter circuit is output from the output terminal of the inverter 93.

In the serial access type mask ROM according to the embodiment of this invention, as shown in FIGS. 3 and 4, the memory cell array 20 is divided into a plurality of (in this example, four) blocks 20-1 to 20-4, the sense amplifiers 22-1 to 22-4 are provided for the respective blocks, four data items are read out during the first row and column access and transferred into the shift registers 23-1 to 23-4, then the column address counter 28 is incremented and next four data items are read out and transferred into the shift registers 23-1 to 23-4. When the serial access cycle is started, the read out four data items are selectively switched by the output switching circuits 24-1 to 24-4 and sequentially transferred to the output buffer 31, the column address counter 28 is incremented during this above operation to read out next four data items and transfer the same into the shift registers 23-1 to 23-4. The above-described pipeline processing is repeatedly effected to serially read out storage data.

In the memory of the above embodiment, since the memory cell array 20 is divided into the four blocks 20-1 to 20-4, the timing at which the column address counter 25 is incremented is different depending on the read out start address (column address signal A0, A1). The longest time allowance can be attained in a case of A1, A0="0", that is, in a case where data readout is started from the memory cell MC in the block 20-1. In the case of A1, A0="3", eight data items are read out by incrementing the column address counter after the row and column access. Since data is first read out from the block 20-4, data is read out while next four data items are read out in four cycles by incrementing the column address counter 28. After this, the same operation is repeatedly effected so as to successively and serially read out data.

It should be noted here that eight data items are read out in the first cycle (random access period). If only four data items are read out, there occurs no problem in the case of the block addresses A1, A0="0", that is, when data read out is started from the memory block 20-1. However, in the case of A1, A0="3", that is, when data read out is started from the block 20-4, since data of the blocks 20-1, 20-2, 20-3 is not read out when data of the block 20-4 is read out by inverting the first read signal $\overline{RD}$ from the "1" level to the "0" level, it becomes impossible to make serial access. That is, the application method is limited. In this embodiment, the problem is solved by effecting the operation twice in the first cycle without increasing the number of sense amplifiers.

In the case where the number of sense amplifiers is four, the operation is effected with the serial cycle 100 ns if time for the column access is 400 ns, and in the case where the number of sense amplifiers is eight, the operation is effected with the serial cycle 50 ns.

Figure 10:
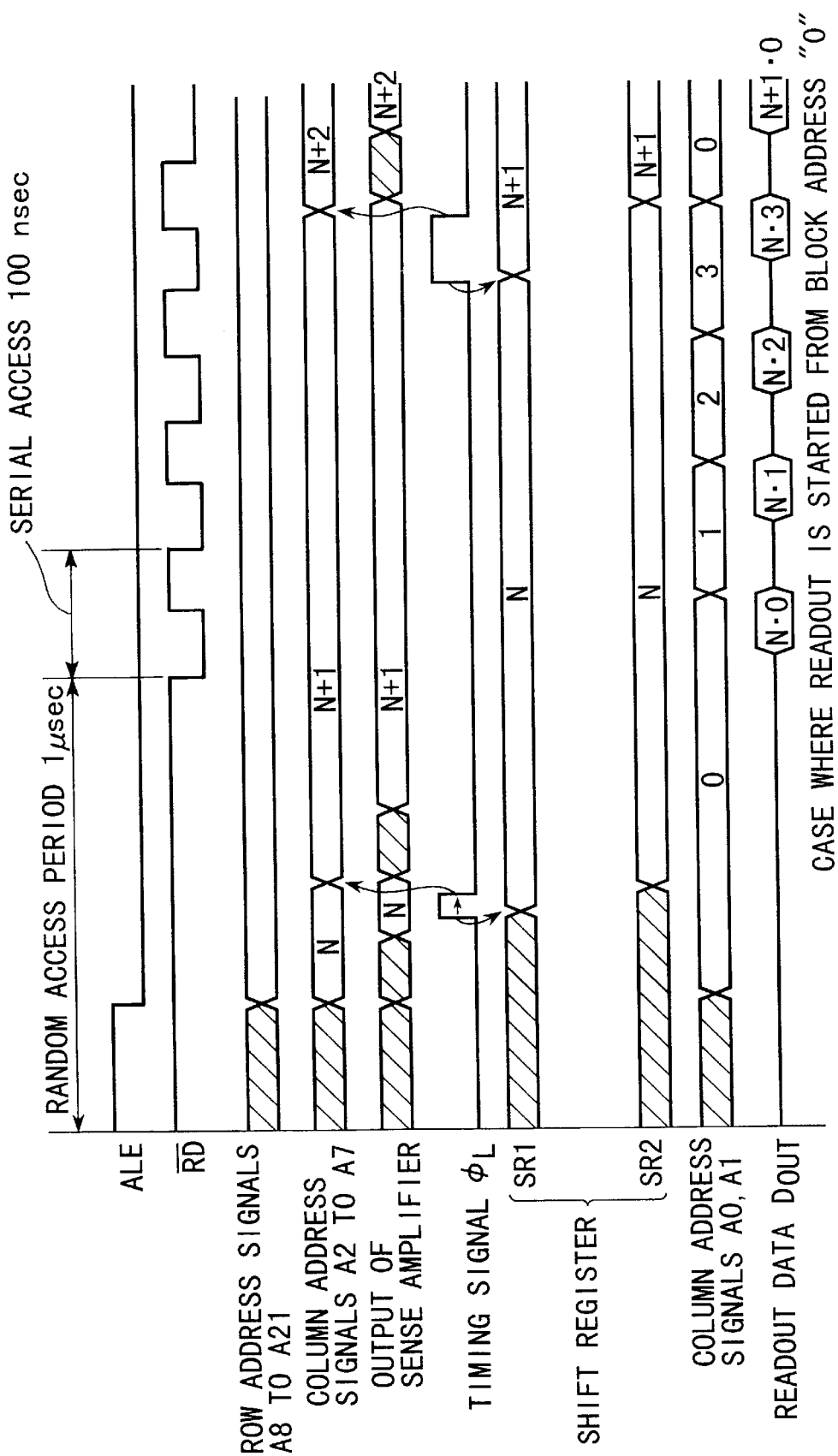
FIG. 10 is a timing chart for illustrating the operation of a serial access memory shown in FIGS. 3 to 8, 9A, 9B and 9C in a case wherein data readout is started from a block address "0"
Figure 11:
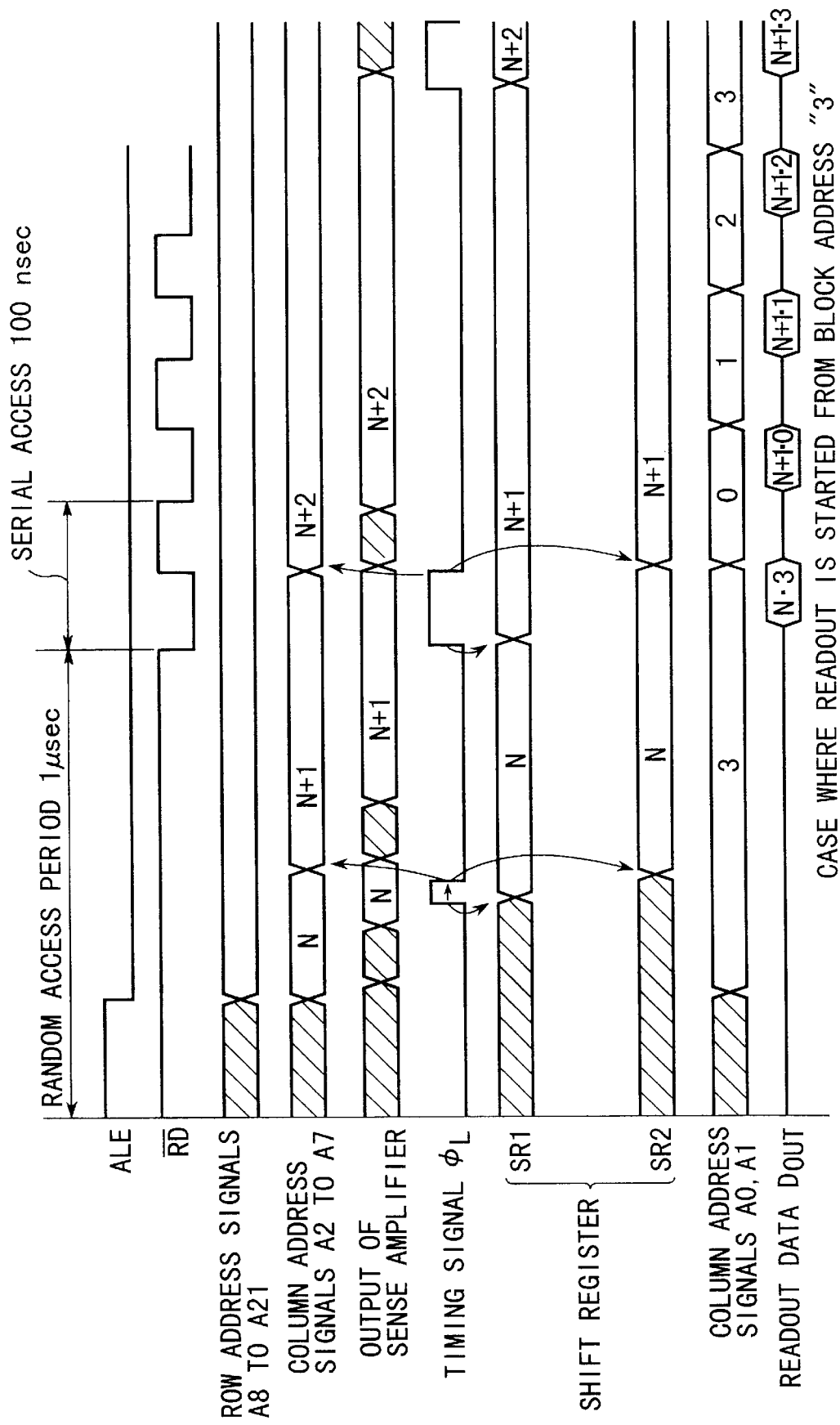
FIG. 11 is a timing chart for illustrating the operation of a serial access memory shown in FIGS. 3 to 8, 9A, 9B and 9C in a case wherein data readout is started from a block address "3".

Next, the access operation is explained in detail with reference to the timing chart of FIGS. 10 and 11 with the above construction. FIG. 10 shows a case wherein data read out is started from the block address "0" and FIG. 11 shows a case wherein data read out is started from the block address "3".

First, a case wherein the block address "0", that is, the memory cell MC in the block 20-1 is selected as the data readout starting address is explained. When the address latch enable signal ALE is changed from the "1" level to the "0" level, the row address signals A8 to A21 are supplied to the row decoder 30, the column address signals A2 to A7 are supplied to the column address counter 28 and the column address signals A0, A1 are supplied to the column address counter 25. The word line WL selected by decoding the row address signals A8 to A21 by the row decoder 30 is driven and the memory cells MC of one row connected to the selected word line WL are selected. The column address signals A2 to A7 set in the column address counter 28 as the initial value are supplied to and decoded by the column decoder 29 and the transistors 32 constituting the column selectors 21-1 to 21-4 are selectively driven by the decoded output. Thus, corresponding bit lines BL for the blocks 20-1 to 20-4 are selected and data items read out from the memory cells MC in the address N which are connected to the above bit lines BL and the selected word line WL are supplied to the sense amplifiers 22-1 to 22-4. The data items are amplified by the sense amplifiers 22-1 to 22-4 and then transferred to and latched by the shift registers 23-1 to 23-4 in response to the timing signals $\phi_L$, $\overline{\phi}_L$ output from the timing circuit 27.

Next, the column address counter 28 is counted up in response to the fall of the timing signal $\phi_L$ and the bit lines BL of the next column are selected by the column decoder 29. Then, data items read out from the memory cells MC in the address (N+1) which are connected to the above bit lines BL and the selected word line WL are supplied to and amplified by the sense amplifiers 22-1 to 22-4.

After this, the count value of the column address counter 25 in which the column address signals A0, A1 are set as the initial value is decoded by the column decoder 26 and data is output in a specified order of the block addresses "0", "1", "2", "3", that is, an output signal of the shift registers 23-1 to 23-4 selected by the output switching circuits 24-1 to 24-4 (transistors 33, 33, . . . ) is sequentially supplied to the output buffer 31. Then, read out data $D_{OUT}$ (N·0, N·1, N·2) is serially output from the output buffer 31 in response to the read signal $\overline{RD}$.

When the block address "3" is selected after the block addresses "0", "1", "2" are selected, a signal C3 is supplied from the column decoder 26 to the timing circuit 27 to output the timing signal $\phi_L$. Data items in the address (N+1) amplified by the sense amplifiers 22-1 to 22-4 are supplied to the shift registers 23-1 to 23-4 in response to the rise of the timing signal $\phi_L$. Further, the column address counter 28 is counted up in response to the fall of the timing signal $\phi_L$ to select the bit lines of the next column for the respective blocks and data items read out from the memory cells MC which are connected to the selected bit lines BL and the selected word line WL are supplied to and amplified by the sense amplifiers 22-1 to 22-4.

After this, the same access operation is sequentially and repeatedly effected to serially output data stored in the memory cell array 20 from the output buffer 31.

Next, a case wherein the block address "3", that is, the memory cell MC in the block 20-4 is selected as the data readout starting address is explained. Also, in this case, when the address latch enable signal ALE is changed from the "1" level to the "0" level, the row address signals A8 to A21 are supplied to the row decoder 30, the column address signals A2 to A7 are supplied to the column address counter 28 and the column address signals A0, A1 are supplied to the column address counter 25. The word line WL selected by decoding the row address signals A8 to A21 by the row decoder 30 is driven and the memory cells MC of one row connected to the selected word line WL are selected. The column address signals A2 to A7 set in the column address counter 28 as the initial value are supplied to and decoded by the column decoder 29 and the transistors 32 constituting the column selectors 21-1 to 21-4 are selectively driven by the decoded output of the column decoder. Thus, corresponding bit lines BL for the respective blocks are selected and data items read out from the memory cells MC which are connected to the above bit lines BL and the selected word line WL are supplied to and amplified by the sense amplifiers 22-1 to 22-4 and then supplied to the shift registers 23-1 to 23-4 in response to the timing signals $\phi_L$, $\overline{\phi_L}$ output from the timing circuit 27.

Next, the column address counter 28 is counted up in response to the fall of the timing signal $\phi_L$ and the bit lines BL of the next column are selected by the column decoder 29. Then, data items read out from the memory cells MC which are connected to the above bit lines BL and the selected word line WL are supplied to and amplified by the sense amplifiers 22-1 to 22-4 and then supplied to the shift registers 23-1 to 23-4.

In this case, since the block address "3" is selected, the signal C3 is supplied from the column decoder 26 to the timing circuit 27 to output the timing signals $\phi_L$, $\overline{\phi_L}$. The next bit lines for the respective blocks are selected in response to the timing signal $\phi_L$ and data items read out from the memory cells MC which are connected to the above bit lines BL and the selected word line WL are supplied to and amplified by the sense amplifiers 22-1 to 22-4 and then supplied to the shift registers 23-1 to 23-4.

After this, the count value of the column address counter 25 in which the column address signals A0, A1 are set as the initial value is decoded by the column decoder 26 and data is output in a specified order of the block addresses "3", "0", "1", "2", that is, an output signal of the shift registers 23-1 to 23-4 selected by the output switching circuits 24-1 to 24-4 (transistors 33, 33, . . . ) is sequentially supplied to the output buffer 31. Then, read out data $D_{OUT}$ (N·3, (N+1)·0, (N+1)·1, (N+1)·2, (N+1)·3) is output from the output buffer 31 in response to the read signal $\overline{RD}$.

After this, the same access operation is sequentially and repeatedly effected to serially output data stored in the memory cell array 20.

As described above, according to this invention, since it is sufficient to provide the sense amplifiers for the respective blocks and it is not required to provide the sense amplifier for each bit line, the number of sense amplifiers can be significantly reduced, the chip size can be reduced and the power consumption can be lowered. Further, the layout of the sense amplifiers is not limited by the pitch between the memory cells and the layout of the sense amplifiers can be easily made even if the memory size is reduced. In addition, a plurality of data sets are read out during the first random access cycle and transferred to the shift registers, then the column is switched to read out a plurality of next data sets. Then, since the data items are read out by effecting the pipeline processing in the serial access cycle, the successive high-speed access operation can be effected irrespective of the start address (even if any one of the memory cells in the block is selected by use of the readout starting address). By this operation, serial access can be made in a virtual grounded type memory. That is, in the virtual grounded type memory, since the source of the selected memory cell is grounded and the sources of the non-selected memory cells are applied with the bias voltage, data cannot be simultaneously read out from all the bit lines, and thus it is difficult to make serial access according to the conventional technology. However, if this invention is applied, a plurality of data sets are read out and transferred to the shift register, then the column is switched to read out a plurality of next data sets, and the data items are read out by effecting the pipeline processing so that data can be successively output.

In the above embodiment, a case where the mask ROM is taken as an example is explained, but this invention can be applied to an EPROM or RAM in exactly the same manner.

As described above, according to this invention, a serial access type semiconductor memory device in which the chip size can be reduced and the power consumption can be lowered by reducing the number of sense amplifiers and a method for accessing the same can be obtained.

Further, a serial access type semiconductor memory device in which the layout of the sense amplifiers is not limited by the pitch between the memory cells and the layout of the sense amplifiers can be easily made even if the memory cell size is reduced and a method for accessing the same can be obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A semiconductor memory device for serially reading out data stored in memory cells, comprising:
    a memory cell array divided into a plurality of blocks;
    a plurality of first means respectively provided for said plurality of blocks, each for amplifying data read out from a memory cell in a corresponding one of the blocks, said plurality of first means equal in number to the plurality of blocks, said plurality of first means selectively coupled to memory cells corresponding to at least an integral multiple of the number of said plurality of first means; and a plurality of second means respectively provided for said plurality of first means, for respectively latching data read out from said plurality of first means, wherein during a first cycle in which random access is made data of an integral multiple (not smaller than 2) of the number of said plurality of first means are first read out to second means selected from said plurality of second means and, in the succeeding serial access cycle the data are serially output.

2. A semiconductor memory device according to claim 1, wherein each of said plurality of first means includes a sense amplifier commonly used by a plurality of columns in a corresponding one of the blocks.

3. A semiconductor memory device according to claim 2, wherein each of said plurality of first means further includes a plurality of column selectors provided between a corresponding one of the blocks and a corresponding one of the sense amplifiers.

4. A semiconductor memory device according to claim 1, wherein said plurality of second means include a plurality of shift registers for respectively latching outputs of said plurality of first means, read out data items from the memory cells being transferred into said plurality of shift registers for the respective blocks in the first row and column access cycle.

5. A semiconductor memory device according to claim 4, wherein after read out data items from the memory cells are transferred into said shift registers, for the respective blocks, a column address is incremented at least once to make column access and read out data items of an integer (not smaller than 2) of the number of said sense amplifiers and then data is serially and successively output by effecting the pipeline processing.

6. A semiconductor memory device according to claim 4, wherein said plurality of second means include a plurality of output switching circuits for respectively selecting outputs of said plurality of shift registers.

7. A semiconductor memory device according to claim 6, further comprising a first column address counter in which a first column address signal for specifying a data read out starting block is set as an initial value, for counting a timing signal in response to an address latch enable signal; a first column decoder for decoding a count value of said first column address counter to control said plurality of output switching circuits; and a timing circuit supplied with the address latch enable signal and a read signal, for supplying a transfer control timing signal to said plurality of shift registers and supplying a counting timing signal to said first column address counter in a case where one of the blocks in the most significant address is selected by said first column decoder.

8. A semiconductor memory device according to claim 7, further comprising a second column address counter in which a second column address signal is set as an initial value, for counting a read signal in response to the address latch enable signal; and a second column decoder for decoding a count value of said second column address counter to control said plurality of column selectors.

9. A semiconductor memory device according to claim 1, further comprising a row decoder for decoding a row address signal to simultaneously select the memory cells on the same row in the plurality of blocks.

10. A semiconductor memory device according to claim 6, wherein said plurality of second means are coupled to an output buffer for outputting data output from said plurality of output switching circuits in response to the read signal.

11. A semiconductor memory device comprising:

a memory cell array divided into n (n is an integer not smaller than 2) blocks;

n column selectors respectively provided for the n blocks;

n sense amplifiers respectively provided for the n blocks, for receiving data on the columns selected by said column selectors;

n shift registers respectively provided for the n blocks, for receiving outputs of said sense amplifiers;

n output switching circuits respectively provided for the n blocks, for receiving outputs of said shift registers;

an output buffer supplied with outputs of said output switching circuits;

a first column address counter in which a first column address signal for specifying a data read out starting block is set as an initial value, for counting a timing signal in response to an address latch enable signal;

a first column decoder for decoding a count value of said first column address counter to control said output switching circuits;

a timing circuit supplied with the address latch enable signal and a read signal, for supplying a transfer control timing signal to said shift registers and supplying a counting timing signal to said first column address counter when the n-th block is selected by said first column decoder;

a second column address counter in which a second column address signal is set as an initial value, for counting the read signal in response to the address latch enable signal;

a second column decoder for decoding a count value of said second column address counter to control said column selectors; and a row decoder for decoding a row address signal and supplying the decoded signal to the n blocks in said memory cell array;

wherein during a first cycle in which random access is made data of an integral multiple (not smaller than 2) of n are read out by effecting, once or more, an operation of incrementing said second column address counter to make column access by said second column decoder after the data read out from the memory cells in the n blocks selected by the column selectors are transferred to said shift registers via said sense amplifiers and, in a succeeding serial access cycle, the data are serially output from said output buffer while effecting pipeline processing.

12. A semiconductor memory device according to claim 11, wherein said timing circuit includes a first circuit portion for generating a pulse signal in response to a change in level of the address latch enable signal, and a second circuit portion for receiving an output signal of said first circuit portion, a signal output from said first column decoder and indicating that the n-th block is selected, and a read signal to create and supply a transfer control timing signal to said shift registers and create and supply the counting timing signal to said first column address counter.

13. A semiconductor memory device according to claim 12, wherein the transfer control timing signal includes complementary signals and the counting timing signal is one of the complementary signals.

14. A semiconductor memory device according to claim 12, wherein the transfer control timing signal includes complementary signals and each of said shift registers has a first stage into which an output signal of a corresponding one of said sense amplifiers is transferred in response to one of the complementary signals and latched in response to the other complementary signal and a second stage into which data latched in said first stage is transferred in response to the other complementary signal and latched in response to said one of the complementary signals.

15. A semiconductor memory device according to claim 11, wherein each of said sense amplifiers includes a first MOS transistor of a first conductivity type having a current path connected at one end to a power supply, a second MOS transistor of a second conductivity type having a current path connected at one end to the gate and the other end of the current path of said first MOS transistor and connected at the other end to a corresponding one of said column selectors, a first inverter having an input terminal connected to said column selector and an output terminal connected to the gate of said second MOS transistor, a second inverter having an input terminal connected to a connection node of the current paths of said first and second MOS transistors, and a third inverter having an input terminal connected to the output terminal of said second inverter and an output terminal connected to a corresponding one of said shift registers.

16. A semiconductor memory device according to claim 11, wherein said output buffer includes a NAND gate having a first input terminal supplied with an inverted signal of the read signal and a second input terminal supplied with an output signal of each of said output switching circuits, a NOR gate having a first input terminal supplied with the read signal and a second input terminal supplied with an output signal of each of said output switching circuits, a first MOS transistor having a current path connected at one end to a power supply and connected at the other end to a data output terminal and a gate connected to the output terminal of said NAND gate, and a second MOS transistor having a current path grounded at one end and connected at the other end to said data output terminal and a gate connected to the output terminal of said NOR gate.

17. A semiconductor memory device according to claim 11, wherein said first column address counter includes a first counter circuit supplied with a counting timing signal, and a second counter circuit supplied with an output signal of said first counter circuit.

18. A semiconductor memory device according to claim 11, wherein said second column address counter includes an inverter having an input terminal supplied with the read signal and a plurality of stages of counter circuits to which an output signal of said inverter is sequentially input.

19. A method for accessing a semiconductor memory device for serially reading out data stored in a memory cell array, comprising the steps of:

making first row and column access in a first row and column access cycle; amplifying and transferring data read out in the first row and column access to a shift register;

incrementing a column address;

reading out data items of an integral multiple (not smaller than 2) of a number of sense amplifiers by making second column access by use of the incremented column address; and subsequently outputting the data serially by making a serial access, wherein serial access is made while the pipeline processing for data items of an integral multiple (not smaller than 2) of the number of sense amplifiers is effected.

20. A method for accessing a semiconductor memory device which includes a memory cell array divided into n (n is an integer not smaller than 2) blocks; n column selectors respectively provided for the n blocks, n sense amplifiers respectively provided for the n blocks, for receiving data on the columns selected by the column selectors; n shift registers respectively provided for the n blocks, for receiving outputs of the sense amplifiers; n output switching circuits respectively provided for the n blocks, for receiving outputs of the shift registers; an output buffer supplied with outputs of the output switching circuits; a first column address counter in which a first column address signal for specifying a data readout starting block is set as an initial value, for counting a timing signal in response to an address latch enable signal; a first column decoder for decoding a count value of the first column address counter to control the output switching circuits; a timing circuit supplied with the address latch enable signal and a read signal, for supplying a transfer control timing signal to the shift register and supplying a counting timing signal to the first column address counter when the n-th block is selected by the first column decoder; a second column address counter in which a second column address signal is set as an initial value, for counting the read signal in response to the address latch enable signal; a second column decoder for decoding a count value of the second column address counter to control the column selectors; and a row decoder for decoding a row address signal and supplying the decoded signal to the n blocks in the memory cell array; comprising the steps of:

transferring data items read out from the memory cells in the n blocks which are selected by the column selectors to the shift registers via the sense amplifiers;

incrementing the second column address counter; and making column access by the second column decoder, and reading out data items of an integral multiple (not smaller than 2) of n by effecting the above operation once or more than once and effecting the pipeline processing for the data items; and subsequently outputting the data serially by making serial access while effecting pipeline processing.

* * * * *